(12) United States Patent
Hoffmann et al.

(10) Patent No.: US 7,893,683 B2
(45) Date of Patent: Feb. 22, 2011

(54) DEVICE, PROBE, AND METHOD FOR THE GALVANICALLY DECOUPLED TRANSMISSION OF A MEASURING SIGNAL

(75) Inventors: Thomas Hoffmann, Berlin (DE); Armin Liero, Berlin (DE)

(73) Assignees: Forschungverbund Berlin E.V., Berlin (DE); Thomas Hoffman, Berlin (DE)

( * ) Notice: Subject to any disclaimer, the term of this patent is extended or adjusted under 35 U.S.C. 154(b) by 125 days.

(21) Appl. No.: 12/158,785

(22) PCT Filed: Dec. 13, 2006

(86) PCT No.: PCT/EP2006/069684

§ 371 (c)(1),
(2), (4) Date: Jun. 23, 2008

(87) PCT Pub. No.: WO2007/071608

PCT Pub. Date: Jun. 28, 2007

(65) Prior Publication Data

US 2008/0290856 A1 Nov. 27, 2008

(30) Foreign Application Priority Data

Dec. 21, 2005 (DE) .................... 10 2005 061 683

(51) Int. Cl.
*G01R 31/00* (2006.01)
(52) U.S. Cl. ....................................................... 324/96
(58) Field of Classification Search .................. 324/96, 324/750–753, 642; 385/42
See application file for complete search history.

(56) References Cited

U.S. PATENT DOCUMENTS

| 3,675,123 | A | | 7/1972 | Hermstein et al. | |
|---|---|---|---|---|---|
| 4,135,152 | A | * | 1/1979 | Stuchly et al. | 324/627 |
| 4,392,074 | A | * | 7/1983 | Kleinschmidt et al. | 310/327 |
| 5,273,610 | A | * | 12/1993 | Thomas et al. | 156/345.28 |
| 5,465,043 | A | | 11/1995 | Sakai | |
| 5,625,284 | A | * | 4/1997 | Tokano | 324/96 |
| 5,635,829 | A | * | 6/1997 | Hamada | 324/96 |
| 5,923,175 | A | | 7/1999 | Richardson | |
| 6,507,014 | B2 | * | 1/2003 | Ito et al. | 250/227.11 |

(Continued)

FOREIGN PATENT DOCUMENTS

DE 19955978 A1 6/2000

(Continued)

*Primary Examiner*—Ha Tran T Nguyen
*Assistant Examiner*—Arleen M Vazquez
(74) *Attorney, Agent, or Firm*—Perkins Coie LLP

(57) ABSTRACT

The invention relates to a device, a probe, and a method for the galvanically decoupling transmission of a measuring signal. A microwave signal is supplied by a transceiver (1) to a sensor (3) by means of a galvanically decoupled waveguide (2). The signal is partially reflected in the sensor (3), the amplitude, phase and/or polarization of the reflected microwave signal containing the information relating to the measuring value. The reflected microwave signal runs through the same waveguide (2) back to the transceiver (1) and is evaluated therein. The invention provides a more simple and economical structure than conventional devices of prior art, as a voltage supply is not required especially on the sensor side as a result of the reflection. In this way, the sensor (3) can also be produced in a very compact manner, minimizing the influence of the measuring signal through the sensor (3).

13 Claims, 2 Drawing Sheets

U.S. PATENT DOCUMENTS

| | | | |
|---|---|---|---|
| 6,603,891 B2 * | 8/2003 | Schumann | 385/12 |
| 2002/0018609 A1 | 2/2002 | Schumann | |
| 2003/0164713 A1 | 9/2003 | Dollinger et al. | |
| 2004/0100280 A1 * | 5/2004 | Ju et al. | 324/642 |
| 2004/0246100 A1 | 12/2004 | Kranz | |
| 2005/0212693 A1 | 9/2005 | Friedrich | |
| 2006/0222302 A1 * | 10/2006 | Levinson | 385/88 |

FOREIGN PATENT DOCUMENTS

| | | |
|---|---|---|
| DE | 19933978 A1 | 1/2001 |
| DE | 10010846 A1 | 9/2001 |
| DE | 101 01 632 B4 | 1/2002 |
| DE | 10361991 A1 | 4/2005 |
| GB | 2344169 | 5/2000 |
| WO | 8909413 A1 | 10/1989 |

* cited by examiner

DEVICE, PROBE, AND METHOD FOR THE GALVANICALLY DECOUPLED TRANSMISSION OF A MEASURING SIGNAL

FIELD OF THE INVENTION

The invention relates to a device, a probe, and a method for the galvanically decoupled transmission of a measuring signal.

BACKGROUND

When developing and testing electrical or electronic components, assemblies, and equipment, it must be possible to sense signals from any points of a test piece.

In the case of electric voltages, for example, oscilloscopes are often used for detection and graphic display. Since almost all oscilloscopes are tabletop devices, they cannot be brought directly into contact with the test object; probes are often used for this purpose.

A probe in that regard is a measuring adapter for connection of a measuring device to a measuring point in a circuit. The task of the probe is the most undistorted possible transmission of the measured value, to the extent possible without noticeably influencing the test piece. An oscilloscope probe comprises the following parts: A probe tip to be brought into contact with the measuring signal on a conducting tract, contacts of a component, and the like; a short, flexible wire with a terminal to sense the reference potential of the measuring signal; a sensor body to be held with the hand; and cables and plug connections for transmission of the measuring signal to the oscilloscope.

There are requirements that are imposed on all probes: A low influence on the measuring signal, particularly a low input capacity, forwarding of the measuring signal to the oscilloscope in a way that is true to the original, i.e., low distortions of the signal form, and low amplitude errors and a high dynamic range should be mentioned here.

Measurements of electric voltages must be taken and transmitted to the oscilloscope in bipolar fashion. One pole can be called "measuring signal" and the other can be called "reference potential of the measuring signal."

The reference potential of the measuring signal is looped through from the test object to the oscilloscope (oscilloscope reference potential). This pole of the oscilloscope is usually connected to the housing and also to the protective conductor of the power supply grid. In the case of multi-channel measurements, the reference potentials of the measuring signals are connected to each other via the oscilloscope.

If the test object has multiple reference potentials for the measuring signals and if they may not be connected to each other or to the protective conductor of the power supply grid, such measurements would have to be dispensed with.

Therefore, the galvanically decoupled transmission of measuring signals is needed for many technical measurement tasks. Examples are oscilloscope measurements on power supplies on the primary and secondary side or in the control and power circuit of electric drives.

Galvanic separation is understood to mean the case in which there is no way for charge carriers to flow from one electric circuit to another, immediately adjacent electric circuit. The most frequent application for galvanic separation is transformers with a connection to the public power grid. Galvanic separation that is produced by two electrically separated coils having a common iron core is required in that case.

An exchange of information between galvanically separated electric circuits is possible using non-electrical transmitters, for example opto-couplers (optical) or transformers (inductive).

In the case of probes for oscilloscopes, differential probes and optoelectronic probe systems provide "virtual" or genuine decoupling of the measuring signal and the oscilloscope. When the decoupling of the measuring signal from the oscilloscope is not necessary, probes will be used in which the measuring signal reference potential is looped through to the oscilloscope. Such probes are above all more economical than the usual differential probes or optoelectronic probe systems that are available on the market.

Differential probes function in accordance with the following principle: The output signal of two probe styluses is supplied on a differential amplifier located in the probe. Or two probes are attached to a differential amplifier over lines. The differential amplifier output is connected to the oscilloscope.

In the ideal case, both differential signals are completely decoupled from the reference potential of the oscilloscope by the differential amplifier. However, these systems have the disadvantage of a finite common-mode input voltage range. The finite common-mode input voltage range of the differential amplifier limits the amplitude of the common-mode signal. Moreover, the common-mode suppression falls as the frequency of the common-mode signal increases. Whereas, in common-mode signals of low frequency (e.g. 50 Hz), good common-mode suppression is achieved even using low-cost differential probes, they are often unusable for common-mode signals of high frequency or voltage increase speed.

Radiation is also disadvantageous in the case of differential probes. Both probes are generally connected to the differential amplifier by cable. As a result, portions of the measuring signal and its reference potential (common-mode signal) are emitted into the environment. As the frequency and amplitude of the common-mode signal rise, the radiation increases. This radiation loads the measuring signal and its reference signal, it is changed unintentionally, and the measured value, even with perfect transmission of the signal, no longer represents the signal to be measured in its undisturbed state.

By employing high-quality components and complex circuitry, some measurements in which the reference potential of the measuring signal is not connected to the reference signal of the oscilloscope can be improved using "high-end" differential probes. However, it is disadvantageous that these solutions are very expensive.

Systems that use optical transmission of the measuring signal are also known. In them, the measuring signal is modulated on an optical substrate, for example by modulation of the radiant power of a semiconductor laser diode. The modulated light is transmitted over an optical fiber. It is demodulated again in the receiver, for example by means of photodiodes. This method allows practically complete decoupling of the measuring signal from the oscilloscope. The optical signal is not prone to interference and does not cause interference.

DE 101 01 632 B4 and WO 89/09413 A1, as well as U.S. Pat. No. 5,465,043, contain various laser-based methods with the use of optical waveguides.

DE 101 01 632 B4 presents an oscilloscope probe head with a fiber optic sensor for galvanically separated detection of electric variables.

WO 89/09413 A1 describes an oscilloscope probe head with a fiber optic sensor for galvanically separated detection of electric variables. The sensor head has an electro-optic crystal by means of which an externally-applied light is influenced by the effect of an electrical field using polarization. The difference between the original polarization and the changed polarization is then converted into an electric variable. Optical fibers are used for transmission.

A probe for potential- and interference-free detection of the intensity of an electric field or the absolute value of a voltage is disclosed in U.S. Pat. No. 5,465,043.

Here, too, the change in the light polarization reflects the field strength or the voltage value.

This involves a relatively complex method with regard to the use of components and manufacturing.

For example, WO 89/09413 A1 requires in the probe an optical system that has elements that must be mechanically fastened and adjusted with regard to their axis, such as a beamsplitter, a mirror, and lenses, and an expensive electro-optical sensor is used in DE 101 01 632 B4.

Other solutions of prior art for galvanically decoupled transmission over optical fibers require on the sensor side an electrical voltage supply for the electronic components such as laser, LED, or amplifier. Providing them in a way that is galvanically decoupled represents an additional difficulty, for example due to the requirement for more space and the limited functional life of a battery. Inductive transmission types are limited as to their dielectric strength and generate a parasite capacitative coupling between the sensor and the evaluation device.

SUMMARY

It is therefore the aim of the present invention to provide a device and a method, as well as a probe, for the galvanically decoupled transmission of a measuring signal which are economical and do not require a voltage supply on the measuring signal side.

For that purpose, a device for the galvanically decoupled transmission of a measuring signal in accordance with the invention has a transceiver for microwaves which is connected to a sensor over means for the galvanically decoupled transmission of microwaves.

The means for the galvanically decoupled transmission of microwaves is a dielectric waveguide or a waveguide having a multiplicity of galvanically conducting conduction pieces, which are successively connected in insulated fashion from each other. The transceiver is a continuous wave (CW) signal transceiver, a transceiver for amplitude modulated, including pulsed, microwave signals, a transceiver for frequency modulated microwave signals, or a transceiver for microwave signals, comprising a multiplicity of superimposed frequencies. The transceiver contains an oscillator and a demodulator. The demodulator is preferably designed as a mixer between the oscillator signal and the reflected signal.

The sensor can be a sensor for electrical signals or a sensor for non-electrical signals. If the sensor receives a non-electrical measuring signal, it converts it into an electrical measuring signal. The sensor contains a reflector and an element that changes the reflection in a manner characterizing the measuring signal (modulator). The modulator has a semiconductor diode, a transistor, or a temperature-dependent resistor.

The means for transmission of the microwave signal together with the transceiver and the sensor is advantageously integrated on a substrate. This allows miniaturization of the device.

As a result of the reflection of the signal in the sensor, it does not require an additional voltage supply.

The probe for galvanically decoupled transmission of measuring signals in accordance with the invention, comprising a probe tip, a probe body with a housing, and a connection to a measuring device, is characterized in that the probe has the above device for the galvanically decoupled transmission of a measuring signal in accordance with the invention, comprising a transceiver for microwaves which is connected to a sensor through means for the galvanically decoupled transmission of microwaves.

The probe tip has a probe stylus and an input circuit. The probe also includes an amplifier that is disposed between the transceiver and the connection to a measuring device. The probe can also have a microcontroller, which is connected to the amplifier.

Accordingly, a method for the galvanically decoupled transmission of a measuring signal in accordance with the invention is characterized in that the method includes the following steps: The supply of a microwave signal by a transceiver, transmission of the microwave signal to a sensor by the transceiver over a galvanically decoupled means for transmission of microwaves, reflection of the signal in the sensor, with changing of the microwave signals in a manner characterizing the measured value, transmission of the reflected microwave signal to the transceiver by the sensor over the galvanically decoupled means for transmission of microwaves, and evaluation of the reflected microwave signal in the transceiver.

The reflected microwave signal is evaluated in the transceiver with regard to amplitude, phase, polarization, or a combination or amplitude, phase, and polarization, preferably in relation to the oscillator signal.

Advantages of the solution in accordance with the invention are above all in the more economical design, which can be easily miniaturized and integrated. The signal is obviously loaded very little during measurement and therefore can be measured without distortion.

BRIEF DESCRIPTION OF THE DRAWINGS

The invention is explained below in reference to several embodiments.

The following are shown in

DETAILED DESCRIPTION

Figure 1:
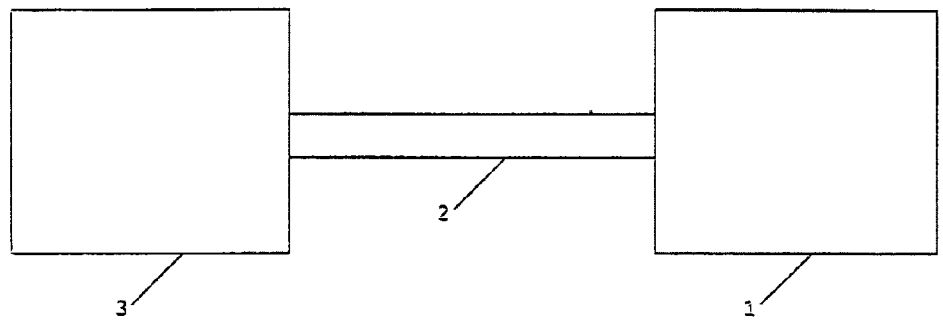
FIG. 1: A schematic view of the device for the galvanically decoupled transmission of signals.

The arrangement in FIG. 1 comprises a transceiver 1, means for the galvanically decoupled transmission of microwaves, and a sensor 3. The means for the transmission of microwaves is preferably provided as a dielectric waveguide.

Transceiver 1 generates a microwave signal and evaluates the signal reflected from sensor 3. It contains an oscillator for the desired microwave frequency. In the simplest case, the reflected microwave signal can be multiplied by the oscillator signal by means of a mixer and supplies a DC signal that depends on the amplitude and phase length of the reflection.

The means for the galvanically decoupled transmission of microwaves can, for example, be a dielectric waveguide 2. Shielding can be provided to minimize disruptive influences.

Sensor 3 contains a reflector 17 and a modulator to change the properties of reflector 17. The measuring signal influences the impedance of the modulator and therefore the reflection properties of reflector 17.

Figure 2:
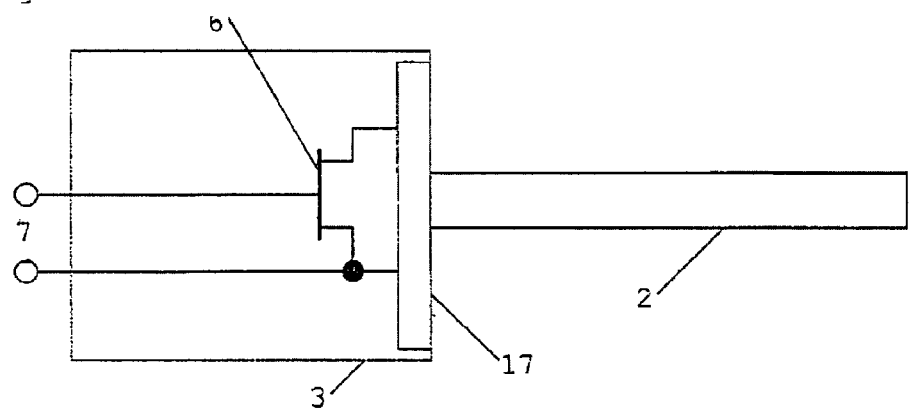
FIG. 2: A detailed schematic view of the device in accordance with the invention in an embodiment for voltage measurement.

The preferred embodiment variant of sensor 3 for voltage measurement is shown in FIG. 2. In this case waveguide 2 is connected to reflector 17 and the latter [is connected] to the drain source channel of a transistor 6. An electrical input 7 is formed by the gate and source of transistor 6. On that input 7 an electrical signal is applied that indicates the input signal on the reflection of the microwave signal by means of the resistance change of the drain-source channel.

Figure 3:
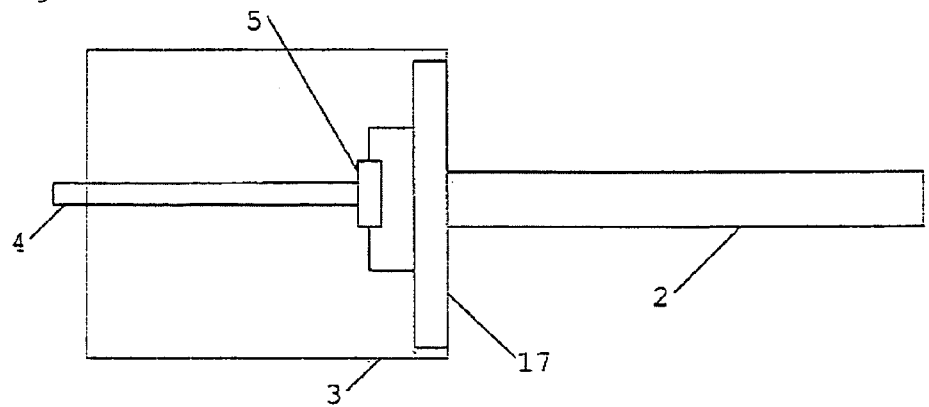
FIG. 3: A detailed schematic view of the sensor of the device in accordance with the invention in an embodiment for temperature measurement.

A further potential realization of the sensor 3 for temperature measurement is shown in FIG. 3. A transitional element 4 connects the waveguide 2 with the terminals of a temperature-dependent resistor 5, for example PT 100. The temperature-dependent mismatch on the output of transitional element 4 leads to the desired temperature-dependent reflection of the microwave signal.

Figure 4:
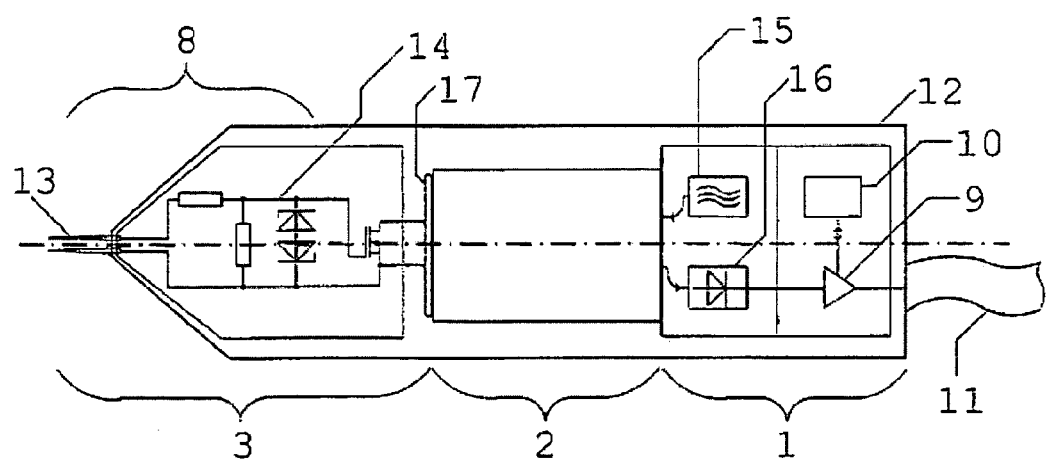
FIG. 4: A schematic view of a probe in accordance with the invention.

FIG. 4 shows a schematic view of the probe in accordance with the invention. The external form of the probe preferably corresponds approximately to that of a fountain pen. Transceiver 1, microwave guide 2, and sensor 3 form one mechanical unit. The functional units of the probe are a means for coming into contact with the measuring signal, preferably a probe tip 8, sensor 3, transceiver 1, the means for the transmission of microwaves, and amplifier 9 and optionally a microcontroller 10. Probe tip 8 can also be designed to be replaceable.

Probe tip 8 preferably contains a probe stylus 13 and a short, flexible line with a mini-terminal or two probe styluses that come into contact with the measuring signal and its reference potential. The probe styluses (or probe stylus 13+flexible line) are connected to an input circuit 14.

Input circuit 14 contains elements to attenuate the measuring signal, to correct the frequency response, and to protect the active element following in the signal path; see sensor 3.

In this embodiment, let reflector 17 be a symmetrical dipole, and the active element a MOSFET. Its drain and source are each brought into contact with one leg of the dipole antenna. A measuring signal and reference potential are applied to the gate and source. The gate-source voltage, which changes with the measuring signal, modulates the channel resistance of the MOSFET. The MOSFET channel over the foot point of the dipole closes the dipole more or less briefly. As a result, the phase and amplitude of the reflected wave are changed as a function of the measuring signal.

In a preferred embodiment, transceiver 1 contains a microwave oscillator 15 and a mixer and demodulator 16. One part of the HF energy generated in oscillator 15 is routed to the sensor or reflector 17, and the other part is supplied to mixer 16. The reflected wave is superimposed in nonlinear fashion in mixer 16 of the oscillator vibration. If the phase and/or amplitude of the reflected wave changes, that generates a changing voltage on demodulator 16.

The means for the transmission of microwaves is preferably a dielectric waveguide 2. It routes the microwave from oscillator 15 to sensor/reflector 3 and back onto mixer 16. Dielectric waveguide 2 insulates the measuring signal from the connected oscilloscope (not shown).

Thus, on one side (probe stylus 13, probe tip 8, sensor 3) everything that is electrically conducting is connected to the measuring signal. On the other side, there is a galvanic connection with the oscilloscope (transceiver 1, amplifier 9, line to oscilloscope 11).

Amplifier 9 amplifies the voltage applied to demodulator 16. In addition, it can contain nonlinear elements and switching elements. The nonlinear elements can equalize nonlinearities in the signal path (caused by MOSFETs, sensor 3, and demodulator 16) and thereby increase the usable dynamic range. Switching elements can also be present which are used for zero point and amplification balancing. They can be controlled by means of a microcontroller 10.

In addition, microcontroller 10 can assume signaling functions, such as overload, self-calibration cycle, and set amplification. The output impedance of amplifier 9 is adapted to the line to oscilloscope 11.

The use of microwaves compared with light waves makes it possible to miniaturize the device and the probe. The measuring sensor in one embodiment is approximately 0.1 cm$^3$ in size. This allows a more economical design. The device can be manufactured to be integrated on a substrate. For example, the methods of thin layer technology can be used on an $Al_2O_3$ substrate. The interference immunity of the arrangement is also increased as a result of miniaturization.

Furthermore, the device in accordance with the invention allows the bandwidth of the measuring signal to be increased compared with light-wave applications. The microwave frequency is preferably between 12 and 30 GHz. The load on the test object is moreover very small, typically less than 1 pF. This means that broadband measurements can be taken on high-ohm measuring points (such as source impedances of 1 kOhm) which cannot be taken using the laser-based methods according to DE 101 01 632 B4, WO 89/09413 A1, and U.S. Pat. No. 5,465,043.

In addition, electrical signals can also be measured in an environment of strong electromagnetic interference. The use of different reference potentials does not cause a problem.

Advantageously, the measurement is not limited by the storage capacity of a storage battery, as is necessary when transmitting signals over optical fibers. Both analog and digital signals can be measured. The shortest pulses are measurable.

The invention is not limited to the embodiments presented here. Rather, it is possible, by combining and modifying the specified means and features, to achieve additional embodiment variants without leaving the scope of the invention.

LIST OF REFERENCES

1 Transceiver
2 Means for the transmission of microwaves
3 Sensor
4 Transitional element
5 Resistor
6 Transistor
7 Transistor input
8 Means for bringing into contact with the measuring signal
9 Amplifier
10 Microcontroller
11 Line to oscilloscope
12 Housing
13 Probe stylus
14 Input circuit
15 Oscillator
16 Mixer and demodulator
17 Reflector

The invention claimed is:

1. Device for the galvanically decoupled voltage measurement, wherein a transceiver for microwaves is connected to a sensor over a means for the galvanically decoupled transmission of microwaves, wherein the means for the galvanically decoupled transmission of microwaves is a dielectric waveguide, which is connected to a reflector, and wherein the sensor includes a transistor to change the reflection of the microwave signal, the reflector being connected to the drain-source channel of the transistor and wherein the electrical input of the device is formed by the gate and source of the transistor.

2. Device in accordance with claim 1, wherein the oscillator of the transceiver is a CW signal oscillator.

3. Device in accordance with claim 1, wherein the oscillator of the transceiver is an oscillator for amplitude modulated, including pulsed, microwave signals.

4. Device in accordance with claim 1, wherein the oscillator of the transceiver is an oscillator for frequency modulated microwave signals.

5. Device in accordance with claim 1, wherein the transceiver has multiple oscillators that generate microwave signals of different frequency which are superimposed.

6. Device in accordance with claim 1, wherein the transceiver contains a demodulator.

7. Device in accordance with claim 1, wherein a mixer that multiplies the oscillator signal by the reflected microwave signal is integrated in the transceiver.

8. Device in accordance with claim 1, wherein the sensor includes a dipole antenna structure for reflection of the microwave signal.

9. Device in accordance with claim 1, wherein the means for the transmission of the microwave signal is integrated on a substrate.

10. Device in accordance with claim 1, wherein the means for the transmission of the microwave signal is provided by a flexible waveguide.

11. Device in accordance with claim 1, wherein the device does not include any additional voltage supply.

12. Device in accordance with claim 1, wherein the means for the transmission of microwaves is provided by successive connection of a multiplicity of galvanically conducting conduction pieces that are insulated from each other.

13. Device in accordance with claim 12, wherein, in addition, shielding is provided for the microwave signal.

* * * * *